United States Patent [19]
Wada et al.

[11] Patent Number: 6,066,896
[45] Date of Patent: May 23, 2000

[54] SEMICONDUCTOR INTEGRATED CIRCUIT DEVICE AND ITS MANUFACTURING METHOD

[75] Inventors: Osamu Wada; Ryo Haga, both of Yokohama; Tomoaki Yabe, Fujisawa; Shinji Miyano, Yokohama, all of Japan

[73] Assignee: Kabushiki Kaisha Toshiba, Kawasaki, Japan

[21] Appl. No.: 09/000,551

[22] Filed: Dec. 30, 1997

[30] Foreign Application Priority Data

Jan. 9, 1997 [JP] Japan ............................. 9-002091

[51] Int. Cl.[7] ........................... H01L 23/48; H01L 23/52; H01L 29/40
[52] U.S. Cl. ..................... 257/758; 257/774; 257/208; 257/209; 257/211; 257/296; 257/903
[58] Field of Search .................. 257/757, 774, 257/208, 209, 211, 296, 903

[56] References Cited

U.S. PATENT DOCUMENTS

| | | | |
|---|---|---|---|
| 5,195,053 | 3/1993 | Hayano | 307/465.1 |
| 5,219,639 | 6/1993 | Sugawara et al. | 428/209 |
| 5,512,514 | 4/1996 | Lee | 438/229 |
| 5,869,901 | 2/1999 | Kusuyama | 257/263 |

*Primary Examiner*—Mahshid Saadat
*Assistant Examiner*—Jhihan B Clark
*Attorney, Agent, or Firm*—Banner & Witcoff, Ltd.

[57] ABSTRACT

On a semiconductor substrate, there are formed a first macro cell having wiring layers of three layers each formed of a metal wiring layer (for example, an aluminum wiring) and a second macro cell having wiring layers of three layers each formed of a metal wiring layer similar to the first macro cell. The first macro cell is formed to have a wiring structure of three wiring layers though the originally necessary number of metal wiring layers is two. The metal wiring layer of each layer on the first macro cell is formed of the same material as the metal wiring layer of the corresponding each layer on the second macro cell. Moreover, the metal wiring layer of each layer is formed to have the same film thickness. In order to connect the first and second macro cells to each other, a macro interconnection wiring is formed to be included in the third wiring layer (uppermost wiring layer).

45 Claims, 9 Drawing Sheets

SEMICONDUCTOR INTEGRATED CIRCUIT DEVICE AND ITS MANUFACTURING METHOD

BACKGROUND OF THE INVENTION

The present invention relates to a semiconductor integrated circuit device including a macro cell on which three or more wiring layers is required to be formed, and its manufacturing method. Particularly, the present invention relates to a semiconductor integrated circuit device in which a plurality of macro cells whose originally necessary number of metal wiring layers differs is embedded on the same semiconductor chip, and its manufacturing method.

Moreover, the present invention relates to a large scale integrated circuit (LSI) in which an ASIC (application-specific integrated circuit) section and a semiconductor memory section are embedded, and its manufacturing method.

This application is based on Japanese Patent Application No. 9-2091, filed on Jan. 9, 1997, the contents of which is cited herein by reference. This application is based on Japanese Patent Application No. 9-2091, filed on Jan. 9, 1997, the contents of which is cited herein by reference. In recent years, in the manufacture of LSI, there is a case in which a plurality of kinds of macro cells is embedded on the same semiconductor chip. In this case, the originally necessary number of metal wiring layers, which is formed on a semiconductor substrate, differs.

Figure 1:
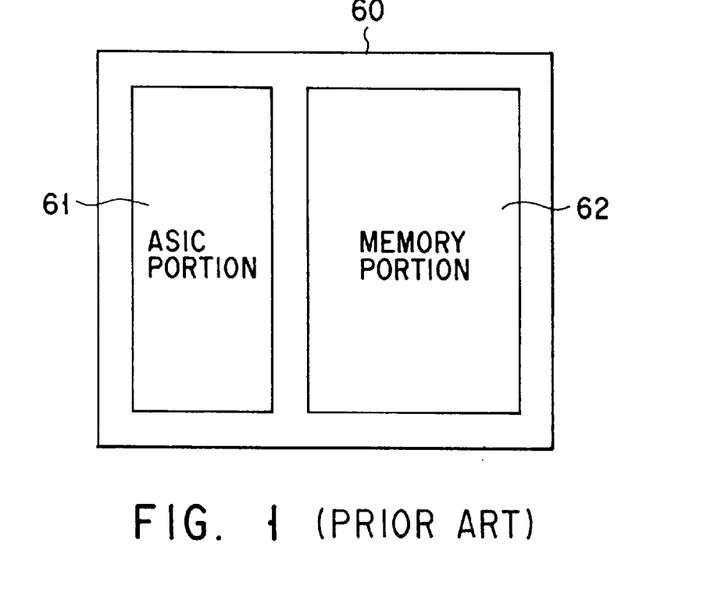
FIG. 1 is a view showing one example of a pattern layout in which an ASIC section and a memory section are arranged in an adjacent area on an LSI chip.

For example, as shown in FIG. 1, there is a case in which an ASIC section 61 and a memory section 62 are formed in an adjacent area on an LSI chip 60. Further, as shown in FIG. 2, there is a case in which an ASIC section 61 having three wiring layers and a memory section having two wiring layers are embedded on a semiconductor substrate 70.

On the LSI chip 60, ASIC section 60 has a first wiring layer 71, a second wiring layer 72, and a third wiring layer 73. Though the memory section 62 has the first and second wiring layers, but no third wiring layer 73.

Figure 2:
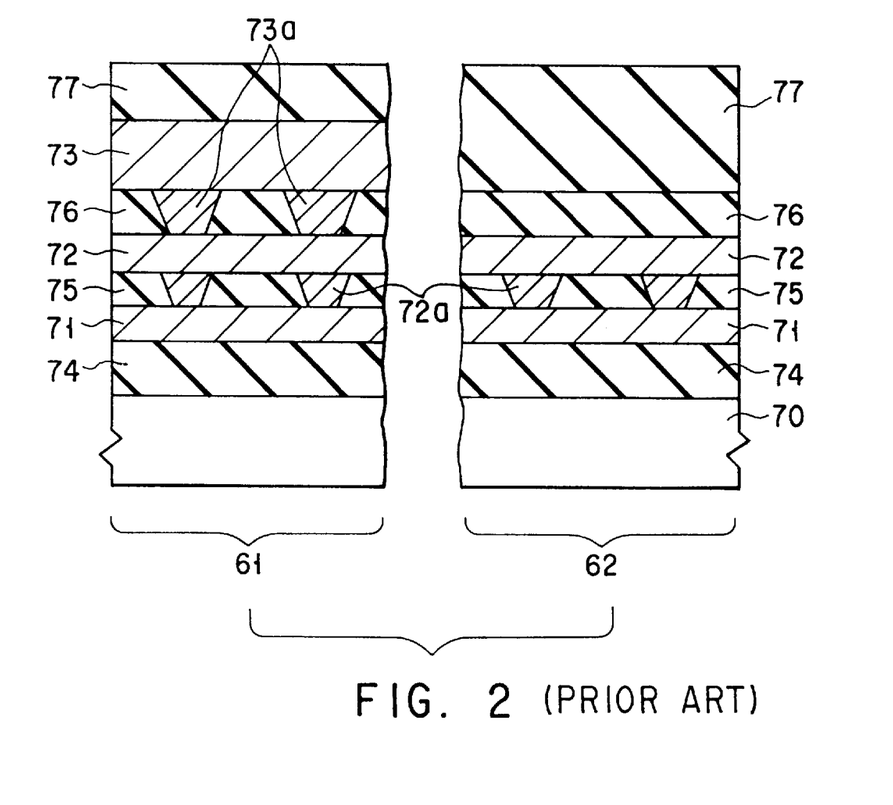
FIG. 2 is a view showing parts of a cross-section of a metallic wiring structure of an LSI on which the ASIC section of a three-layered wiring and a memory section of a two-layered wiring are embedded on a semiconductor substrate according to prior art.

In FIG. 2, reference numeral 72a shows a first contact plug for connecting the second wiring layer 72 to the first wiring layer 71. Reference numeral 73a shows a second contact plug for connecting the third wiring layer 73 to the second wiring layer 72. Reference numeral 74 is a first insulating layer on the semiconductor substrate. Reference numeral 75 is a second insulating layer on the first wiring layer 71. Reference numeral 76 is a third insulating layer on the second wiring layer 72. Reference numeral 77 is a fourth insulating layer formed on the third wiring layer 76 of the memory section 62 and the third wiring layer 73 of the ASIC section 61.

In forming the third wiring layer 73 of the ASIC section 61 on the same chip as the memory section, a surface of the second wiring layer 72 is flattened in the conventional process as shown in FIG. 2. Due to this, a film thickness of the second wiring layer 72 is reduced, and its wiring resistance is increased. However, it is assumed that the macro cell whose number of the necessary wiring layers is small (memory cell section 62 in this example), the uppermost wiring layer (second wiring layer 72) is used as a power supply line. In this case, a potential drop, which is caused by an increase in the wiring resistance, is increased. Also, it is assumed that the uppermost wiring layer is used as a signal line, which determines an operation velocity of the memory, that is, a critical path. In this case, a wiring delay is increased by an increase in the wiring resistance. Due to this, an electrical characteristic (performance) as an LSI chip is lowered.

Thus, in the conventional LSI in which a plurality of macro cells whose originally necessary number of metal wiring layers differs is embedded on the same semiconductor chip, the film thickness of the wiring layer having a macro cell whose number of the necessary wiring layers is small is reduced, and its wiring resistance is increased. As a result, the potential drop and the wiring delay are increased by the increase in the wiring resistance.

BRIEF SUMMARY OF THE INVENTION

An object of the present invention is to provide a semiconductor integrated circuit device, which can restrict an increase in wiring resistance and prevent an increase in a potential drop and a wiring delay caused by the wiring resistance when a plurality of macro cells whose originally necessary number of metal wiring layers differs is embedded on the same chip, and its manufacturing method.

According to a first aspect of the present invention, there is provided a semiconductor integrated circuit device comprising: a semiconductor substrate having first and second macro cells each having a plurality of elements formed; and wiring layers of N layers (N≧3) formed on said semiconductor substrate sequentially from a first wiring layer to an N-th wiring layer, wherein N−1 wiring layer on said first macro cell includes a first wiring pattern having a plurality of pattern segments, N-th wiring layer on said first macro cell includes a second wiring pattern having one or more same pattern segments among the plurality of pattern segments, and the plurality of pattern segments include one or more contact pattern, respectively.

According to a second aspect of the present invention, there is provided a semiconductor integrated circuit device comprising: a semiconductor substrate having first and second macro cells each having a plurality of elements formed; and wiring layers of N layers (N≦3) formed on said semiconductor substrate sequentially from a first wiring layer to an N-th wiring layer, wherein N−2 wiring layer on said first macro cell includes a first wiring pattern having a plurality of pattern segments, each of said plurality of pattern segments has at least one contact pattern, N−1 wiring layer on said first macro cell includes one or more same contact pattern as the contact pattern formed on said first wiring pattern, and the Nth wiring layer on said first macro cell includes a second wiring pattern having one or more same pattern segments among the plurality of pattern segments.

According to a third aspect of the present invention, there is provided a semiconductor integrated circuit device comprising: a semiconductor substrate having a plurality of macro cells whose necessary number of metal wiring layers differs; and a plurality of metal wiring layers formed on said semiconductor substrate, wherein an uppermost wiring layer of the macro cell whose necessary number of metal wiring layers is smaller is formed of the same wiring layer as an uppermost wiring layer of the macro cell whose necessary number of metal wiring layers is larger.

According to a fourth aspect of the present invention, there is provided a method of manufacturing a semiconductor integrated circuit device in which first and second macro cell regions whose necessary number of metal wiring layers formed on a semiconductor substrate differs are embedded on the same chip comprising the step of: forming an uppermost wiring layer of the macro cell whose necessary number of metal wiring layers is smaller is formed of the same wiring layer as an uppermost wiring layer of the macro cell whose necessary number of metal wiring layers is larger.

According to a fifth aspect of the present invention, there is provided a method of manufacturing a semiconductor integrated circuit device comprising the steps of: forming a semiconductor substrate having first and second macro cells each having a plurality of elements formed; and forming wiring layers of N layers (N≧3) on said semiconductor substrate sequentially from a first wiring layer to an N-th wiring layer, the step of forming the wiring layers of N layers includes a sub-step of forming said N−1 wiring layer to include a first pattern having a plurality of pattern segments, and a sub-step of forming said N-th wiring layer on said first macro cell to include a second wiring pattern having one or more same pattern segments among the plurality of pattern segments, and the plurality of pattern segments include one or more contact pattern, respectively.

According to a sixth aspect of the present invention, there is provided a method of manufacturing a semiconductor integrated circuit device comprising the steps of: forming a semiconductor substrate having first and second macro cells each having a plurality of elements formed; and wiring layers of N layers (N≦3) formed on said semiconductor substrate sequentially from a first wiring layer to an N-th wiring layer, wherein the step of forming said wiring layers of N layers includes: a sub-step of forming said N−2 wiring layer such that the N−2 wiring layer on said first macro cell includes a first wiring pattern having a plurality of pattern segments wherein each of said plurality of pattern segments has at least one contact pattern: a sub-step of forming said N−1 wiring layer such that said N−1 wiring layer on said first macro cell includes one or more same contact pattern as the contact pattern formed on said first wiring pattern; and a sub-step of forming said Nth wiring layer such that said Nth wiring layer on said first macro cell includes a second wiring pattern having one or more same pattern segments among the plurality of pattern segments.

Thus, according to the above-mentioned structure and the method, the increase in the wiring resistance can be restricted even if the film thicknesses of the wiring layer of the macro cell whose originally necessary number of wiring layers is small is reduced when a plurality of macro cells whose originally necessary number of metal wiring layers is embedded on the same semiconductor chip. As a result, the potential drop caused by the increase in the wiring resistance and the increase in the wiring delay can be restricted, thereby preventing the deterioration of the performance.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

In the LSI of this invention, a plurality of macro cells whose originally necessary number of metal wiring layers differs is embedded on the same semiconductor chip to have metal wiring layers of N (N≧3) layers. Then, the feature of the LSI of this invention lies in the metal wiring structure of the macro cell whose originally necessary number of metal wiring layers is small.

Figure 3:
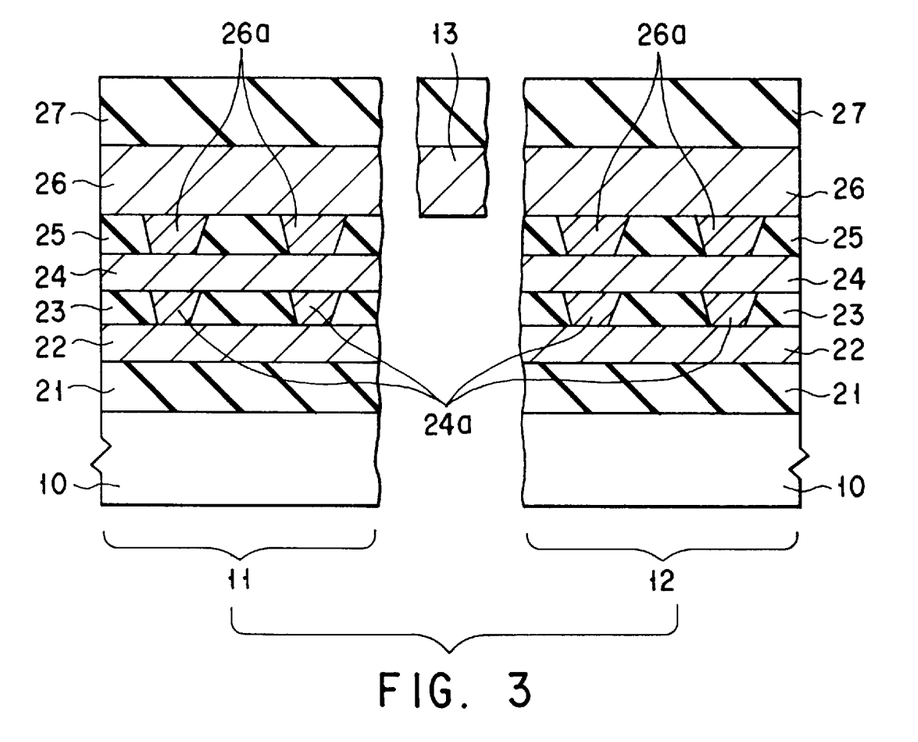
FIG. 3 is a view showing parts of a cross-section of a metal wiring structure of an LSI of a first embodiment of the present invention.
Figure 4A:
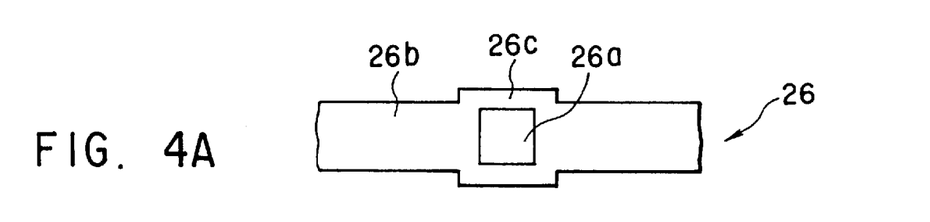
FIGS. 4A and 4B are views respectively showing contact patterns formed in the metal wirings of the second and third wiring layers of the metal wiring layers of FIG. 3.
Figure 4B:
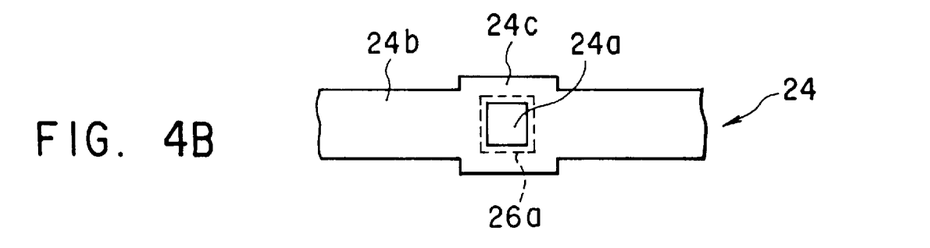

FIG. 3 is a view showing parts of a cross-section of a metal wiring structure of an LSI of a first embodiment of the present invention. FIGS. 4A and 4B are views respectively showing contact patterns formed in the metal wirings of the second and third wiring layers of the metal wiring layers of FIG. 3.

The LSI of FIG. 3 comprises a first macro cell 11 and a second macro cell 12. The first macro cell 11 has a wiring layer of three layers. Each of three layers, which is made of a metal wire layer (e.g., aluminum wiring), is formed on the semiconductor substrate 10. Similarly, the second macro cell 12 has a wiring layer of N layers. Each of N layers is formed on the semiconductor substrate 10, and is made of a metal wiring layer.

The first macro cell 11 is an ASIC section including at least one of a logic section such as a CPU and an analog section. The second macro cell 12 is e.g., a semiconductor memory section in which a memory cell array is formed. A sensing amplifier, a row decoder, a secondary sensing amplifier and a write buffer, or other circuit section may be formed in the semiconductor memory section. Similar to the ASIC section 61 and the memory section 62 of FIG. 2, the first macro cell 11 and the memory section 12 may be arranged in the adjacent area on the LSI chip.

First, the following will explain the ASIC section 11.

In the ASIC section 11, the number of necessary metal wiring layers is three. On the semiconductor substrate 10, a first insulating layer 21, a first wiring layer 22, a second insulating layer 23, a second wiring layer 24, a third insulating layer 25, a third wiring layer 26, and a fourth insulating layer 27 are sequentially stacked. Moreover, the ASIC section 11 has a first contact plug 24a for connecting the second wiring layer 24 to the first wiring layer 22, and a second contact plug 26a for connecting the third wiring layer 26 to the second wiring layer 24.

The film thickness of the first wiring layer 22 can be e.g. 500 nm. Also, the film thickness of the second wiring layer 24 can be e.g. 500 nm. The film thickness of the third wiring layer 26 can be e.g. 1000 nm. Moreover, the film thickness of the second insulating layer 23 can be e.g. 600 nm. The film thickness of the third insulating layer 25 can be e.g. 700 nm. Also, the film thickness of the fourth insulating layer 27 can be e.g. 600 nm.

The first and second contact plugs 24a and 26a may be formed by a burying process. Also, the first contact plug 24a may be formed as a part of the second wiring layer 24 at the same time. Also, the second contact plug 26a may be formed as a part of the third wiring layer 26 at the same time.

Next, the following will explain the memory section 12.

In the memory section 12, though the originally necessary number of metal wiring layers is two, the memory section 12 may be formed to have a three-layered wiring structure similar to the ASIC section 11. Moreover, each layer of the memory section 12 can be formed of the same material as the corresponding each layer of the ASIC 11. Also, each layer of the memory section 12 can be formed to have the same film thickness as the corresponding each layer of the ASIC 11.

Furthermore, in order to connect the ASIC section 11 to the memory section 12, e.g., a macro cell interconnection wiring 13 is formed to be included in the third wiring layer.

The memory section 12 has the first insulating layer 21, the first wiring layer 22, the second insulating layer 23, the second wiring layer 24, the third insulating layer 25, the third wiring layer 26, and the fourth insulating layer 27, which are sequentially stacked on the semiconductor substrate 10. The ASIC section 11 has the first contact plug 24a for connecting the second wiring layer 24 to the first wiring layer 22, and the second contact plug 26a for connecting the third wiring layer 26 to the second wiring layer 24.

The first and second contact plugs 24a and 26a may be formed by the burying process. Also, the first contact plug 24a may be formed as a part of the second wiring layer 24 at the same time. Also, the second contact plug 26a may be formed as a part of the third wiring layer 26 at the same time.

Figure 5:
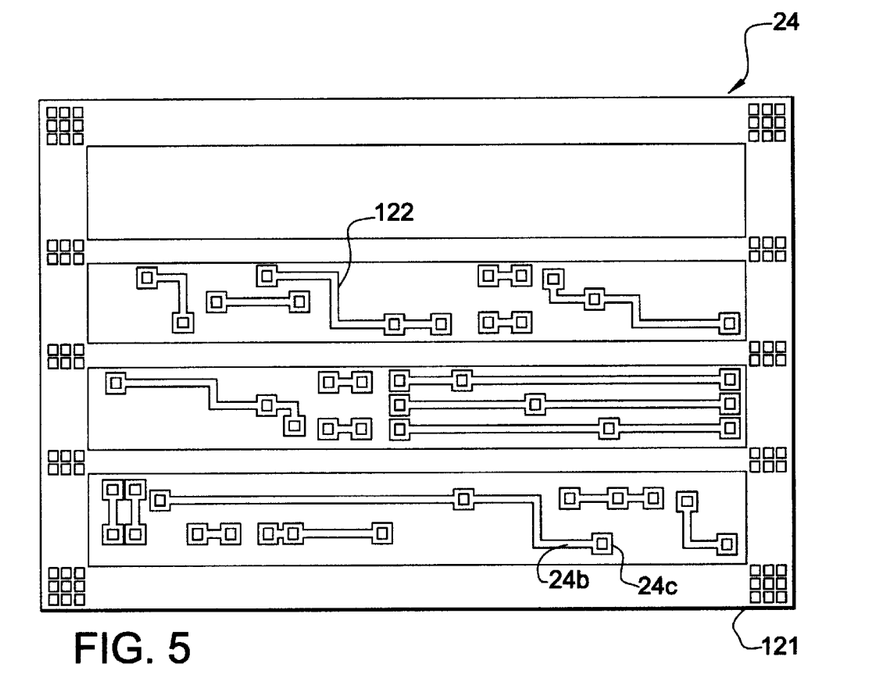
FIG. 5 is a view showing one example of a wiring pattern of the second wiring layer in the memory section of FIG. 3.
Figure 6A:
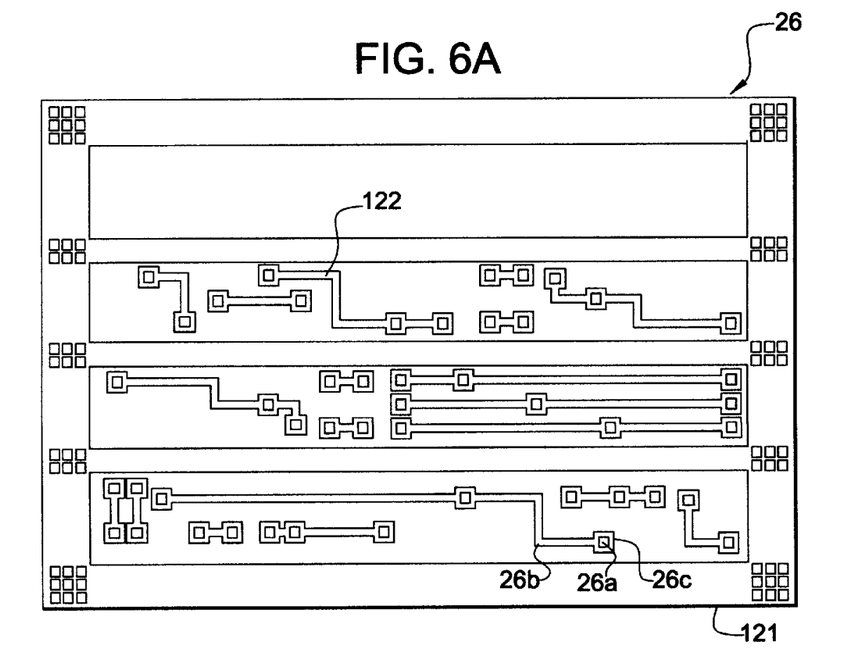
FIGS. 6A to 6C are views respectively showing the wiring patterns of the third wiring layer in the memory section of FIG. 3.
Figure 6B:
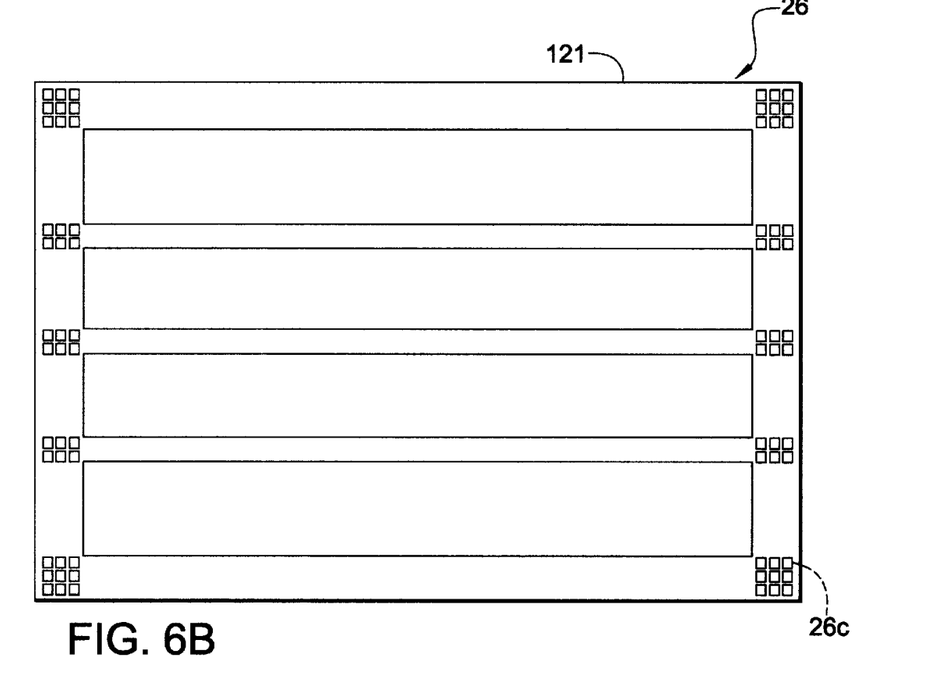
Figure 6C:
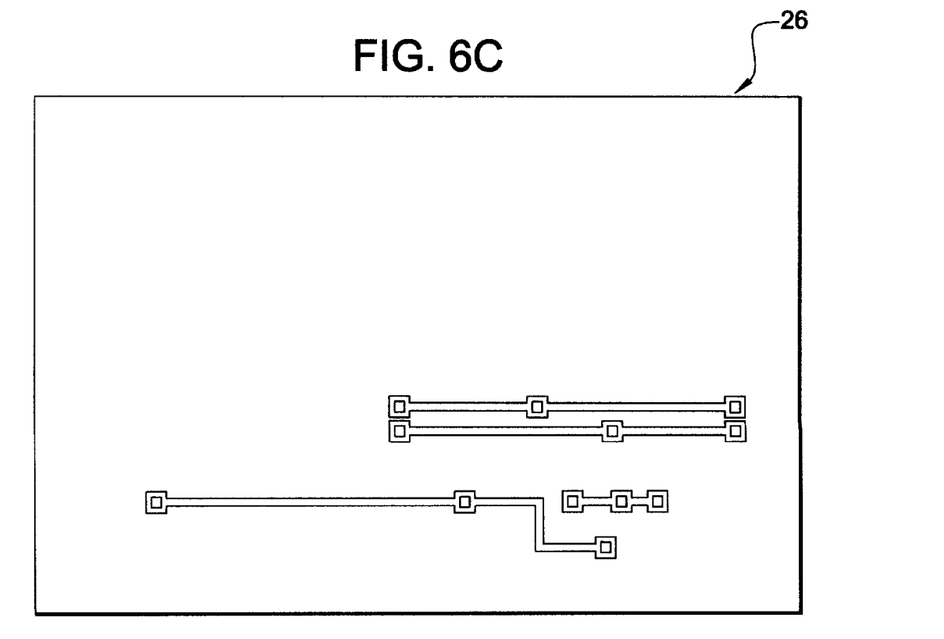

Next, the following will explain the wiring pattern to be designed on the second and third wiring layers 24 and 26 in the memory section 12 with reference to FIGS. 5A to 6C. FIGS. 4A and 4B are views each showing a contact pattern included in each of the wiring patterns of the third and second wiring layers of FIG. 3. FIG. 5 shows an example of the wiring pattern of the second wiring layer of the memory cell section 12 (second macro cell). FIGS. 6A to 6C show examples of patterns, which can be used as a wiring pattern of the third wiring layer of the memory section.

The wiring pattern formed on the second wiring layer 24 comprises a plurality of pattern segments as shown in FIG. 5. A pattern segment 121 shown by a thick line width is a power supply line, and pattern segments 122 shown by a thin line width are signal lines. Generally, the respective pattern segments have at least one contact pattern as shown in FIG. 4B. In other words, FIG. 4B shows an enlarged part of each pattern segment. As shown in FIG. 4B, a contact pattern 24c is provided on a part 24b of the pattern segment.

The contact patterns shown in FIG. 5 are formed in accordance with a design rule, and they are connected to the first wiring layer or the third wiring layer through contact plugs 24a and 26a.

Next, the following will explain the third wiring layer 26. In the LSI memory section 12 of the first embodiment, some examples of the wiring patterns, which are applicable to the third wiring layer, are shown with reference to FIGS. 6A to 6C.

The wiring pattern shown in FIG. 6A is an example to which the same wiring pattern as the wiring pattern formed on the second wiring layer 24 (FIG. 5) is applied. Moreover, in the wiring pattern, a contact pattern is formed at the same position as the wiring pattern formed in the second wiring layer 24. In other words, if the part of each pattern segment is enlarged, the enlarged part is shown in FIG. 4A. That is, a contact pattern 26c is formed on a part 26b of the pattern segment. These contact patterns are formed in accordance with the design rule, and they are connected to the second wiring layer through the contact plug 26a.

Thus, the second wiring layer 24 and the third wiring layer 26 have the above-mentioned wiring patterns, thereby making it easy to execute the process in generating the pattern of the metal wiring layer of LSI by CAD (Computer Assistant Design).

In the case of generating the pattern of each metal wiring layer by CAD, the wiring pattern of the first layer 22 and that of the second wiring layer 24 are different from each other. However, a load on the software of CAD is reduced since the wiring patter of the second layer 24 and that of the third layer are the same as each other. Similarly, since the contact patterns of the second and third wiring layers are formed at the same position, the load on the software of CAD is reduced.

Next, the wiring pattern shown in FIG. 6B will be explained. The wiring pattern of FIG. 6B shows that only a pattern segment 121, serving as a power supply line, is extracted from the wiring pattern of the second wiring layer (FIG. 5). Even in this wiring pattern, the contact pattern 26c is formed. at the same position as the contact pattern of the power supply line of the wiring pattern of FIG. 6A.

In generating the wiring pattern of FIG. 6B by CAD, only the pattern segment is extracted from the wiring pattern of the second wiring layer, so that the wiring pattern can be generated. As a result, the load on the software of CAD is reduced.

Next, the wiring pattern of FIG. 6C will be explained. The wiring pattern of FIG. 6C shows only a critical path, i.e., a signal line for determining the operation speed of LSI, which is extracted from the plurality of pattern segments, serving as signal lines of the wiring pattern of the second wiring layer (FIG. 5). Even in this wiring pattern, the contact pattern is formed at the same position as the contact pattern of the critical path of the wiring pattern of FIG. 6A.

In generating the wiring pattern of FIG. 6C, only the critical path is extracted from the wiring pattern of the second wiring layer, so that the wiring pattern can be generated. As a result, the load on the software of CAD is reduced.

As the other wiring patterns, which can be used in the third wiring layer, there may be used a pattern in which only the signal is extracted from the wiring pattern of FIG. 6C.

As explained above, according to the wiring structure of LSI of the first embodiment, in forming the ASIC section 11 and the memory section 12 on the same chip, the wiring layout of the second wiring layer 24 of the memory section 12 is formed on the third wiring layer 26 on the same scale. The film thickness of the wiring is formed to have the same as the thickness of the third wiring layer 26 of the ASIC section 11.

Therefore, it is assumed that there is used the process of flattening the surface of the metal wiring layer other than the uppermost metal wiring layer and the surface of the insulating layer other than the uppermost insulating layer. Even if the film thickness of the second wiring layer 24 of the memory section 12 is reduced, the reduction of the film thickness is compensated by the wiring pattern 26b of the third wiring layer. As a result, the increase in the wiring resistance of the wiring pattern of the second wiring layer can be restrained.

It is assumed that only the power supply line for supplying the operation power of the memory section 12 is provided as the wiring pattern of the second wiring layer. In this case, the increase in the wiring resistance of the wiring pattern of the second layer can restrained, the voltage drop caused by the increase can be restrained, and the deterioration of the performance can be controlled.

It is assumed that the power supply line for supplying the operation power of the memory section 12 and the signal line for transmitting the signal of the memory section 12 are provided as the wiring pattern of the second wiring layer. In this case, the increase in the wiring resistance of the wiring pattern of the second layer can restrained, the voltage drop caused by the increase, and the increase in the wiring delay can be restrained, and the deterioration of the performance can be controlled. In the power supply line and the signal line of the wiring pattern of the second wiring layer, only the signal line (critical path) for determining the operation speed of the memory section 12 may be provided as the wiring pattern of the third wiring layer.

The wiring pattern of the third wiring layer is the same as that of the second wiring pattern, and both have the same potential, and a capacitive coupling therebetween is relatively small.

Next, the following will explain the second embodiment of the present invention.

Figure 7:
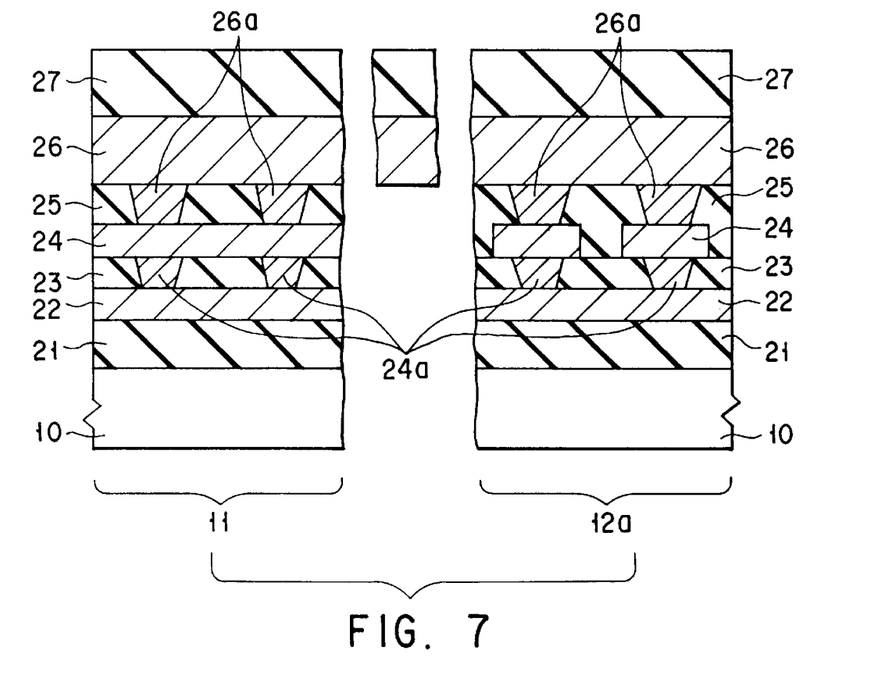
FIG. 7 is a view showing parts of a cross-section of a metal wiring structure of an LSI of a second embodiment of the present invention.
Figure 8A:
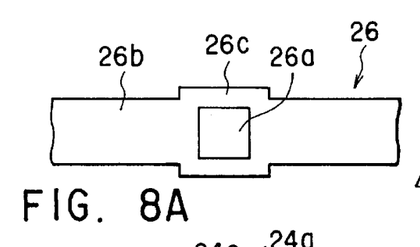
FIGS. 8A to 8C are views respectively showing contact patterns formed in the metal wirings of the second and third wiring layers of the metal wiring layers of FIG. 7.
Figure 8B:
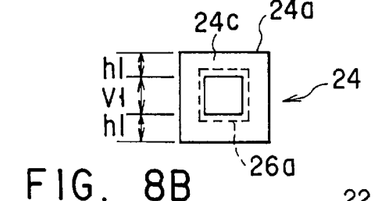
Figure 8C:
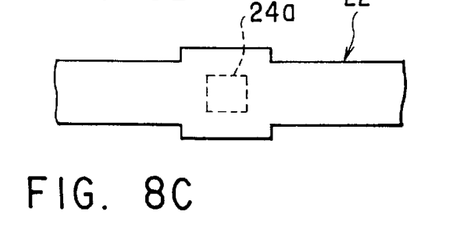

FIG. 7 shows one example of the cross-section of the metal wiring structure of LSI of the second embodiment of the present invention. FIGS. 8A to 8C show the enlarged parts (including the contact patterns) of the wiring patterns of the third wiring layer of FIG. 7, the second wiring layer, and the first wiring layer, respectively.

As compared with the metal wiring structure of the LSI of the first embodiment, the LSI of the second embodiment has the structure in which only the contact pattern 24c of the first wiring layer is formed on the wiring pattern of the second wiring layer in the memory section 12a. In other words, the wiring pattern 24b of the first embodiment is not formed in the second embodiment. Moreover, in the second embodiment, the wiring pattern of the third wiring layer of the memory section 12a is the same as the wiring pattern of the first wiring layer 22. The other structure of the second embodiment is the same as the first embodiment, and the same reference numerals are added to the common portions, and the explanation is omitted.

According to the wiring structure of the LSI of the second embodiment, in forming the ASIC section 11 and the memory section 12 on the same chip, the wiring layout of the second wiring layer 24 of the memory section 12a is originally formed on the third wiring layer 26. In this case, the film thickness of the wiring is formed to have the same thickness of the third wiring layer of the ASIC section 11. On the second wiring layer 24 of the memory section 12a, there is formed the pattern on which only the contact pattern 24c of the wiring layout formed on the third wire layer 26 is left. Then, the diameter of the contact pattern 24c formed on the second wiring layer 24 may be set to V1+2×h1 where a diameter of the contact pattern on the first wiring layer 22 of the memory section 12a is V1, a fringe of the contact pattern 24c of the second wiring layer 24 is h1.

The above contact pattern design can simplify the software processing on the CAD, thereby improving the coefficient of the design processing.

Therefore, even if the film thickness of the contact pattern 24c of the second wiring layer 24 is reduced by the use of the process for flattening the surface of the second wiring layer 24, the film thickness can be compensated by the third wiring layer 26. As a result, the increase in the wiring resistance can be restrained.

The pattern of the second wiring layer 24 is only the contact pattern 24c. Then, the ratio of the pattern area of the second wiring layer 24 to the pattern area of the third wiring layer 26 is small, and the ratio of the pattern area of the second wiring layer 24 to the pattern area of the second wiring layer 22 is small. Since the distance between the third wiring layer 26 and the first wiring layer 22 is large, the capacitive coupling between the opposing wiring patterns is smaller than the case of the first embodiment.

Furthermore, the second embodiment can be applied to a case in which the difference between the number of wiring layers necessary to the metal wiring of the ASIC section 11 and the number of wiring layers necessary to the metal wirings of the memory section 12a are two or more. In other words, the wiring layers having only the contact pattern formed are layered to correspond to the difference, so that the same effect as the mentioned above can be obtained.

Next, the following will explain the wiring structure of the LSI of the third embodiment of the present invention.

Figure 9A:
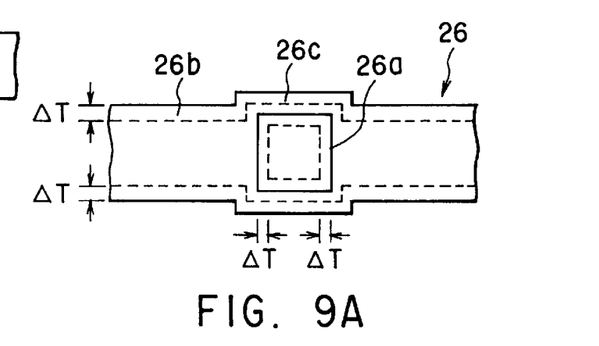
FIGS. 9A and 9B are views respectively showing modifications of contact patterns formed in the metal wirings of the second and third wiring layers of the metal wiring layers of FIG. 7.
Figure 9B:
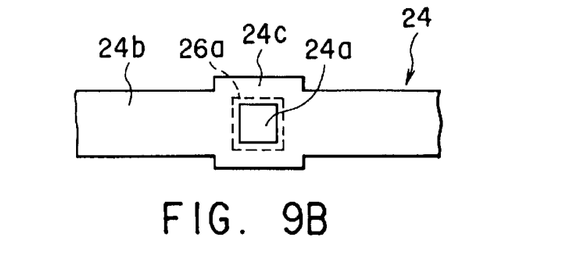

In this third embodiment, the wiring width of the wiring pattern of the second wiring layer and that of the wiring pattern of the third wiring layer is different from each other. FIGS. 9A and 9B show the enlarged parts (including the contact patterns) of the wiring patterns of the third and second wiring layers, respectively. The contact patterns 24c and 26c shown in these figures are formed to have a difference in conversion between the wiring width of the wiring pattern 26b of the third wiring layer and that of the wiring pattern 24b of the second wiring layer. The other structure of the second embodiment is the same as the first embodiment, and the same reference numerals are added to the common portions, and the explanation is omitted.

The third embodiment can be applied to a case in which the design rule of the third wiring layer 26 is 1.2 times as large as that of the second wiring layer 24. More specifically, it is assumed that a maximum wiring width of the wiring pattern 24b of the second wiring layer is 0.5 μm and a maximum wiring width of the wiring pattern 26b of the third wiring layer is 0.6 μm. The wiring pattern 26b of the third wiring layer is designed such that both sides of the wiring width of the wiring pattern 24b of the second wiring layer are enlarged by ΔT=0.05 μm.

According to the wiring structure of the LSI of the third embodiment, if the design rule of the second wiring layer 24 and that of the third wiring layer 26 are different from each other, the difference in conversion between the wiring widths is provided to correspond to the design rule of each of the wiring layers. This is useful in realizing the chip structure, which does not violate the design rule.

Moreover, the above contact pattern design can simplify the software processing on the CAD, thereby improving the coefficient of the design processing.

Next, the following will explain the manufacturing method of the LSI of the first embodiment of the present invention with reference to FIGS. 10A to 10E.

Figure 10A:
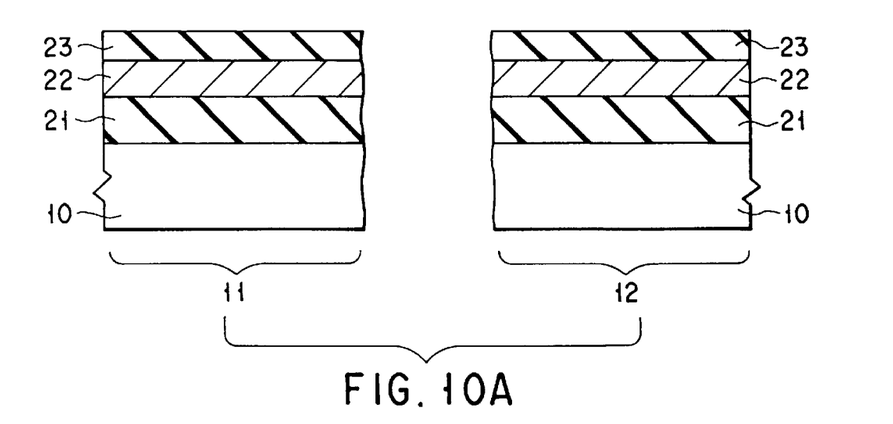
FIGS. 10A to 10E are cross-sectional views respectively showing metal wiring processes of the LSI of FIG. 3.

The element is formed in each of the first macro cell area 11 and the second macro cell area 12, so that the first insulating layer 21 is formed on the semiconductor substrate. On the first insulating layer 21, there is formed the first wiring layer 22 for electrically conducting the respective electrodes of the element formed on the semiconductor substrate with a predetermined pattern. Moreover, the second insulating layer 23 is formed on the first wiring layer (FIG. 10A).

Figure 10B:
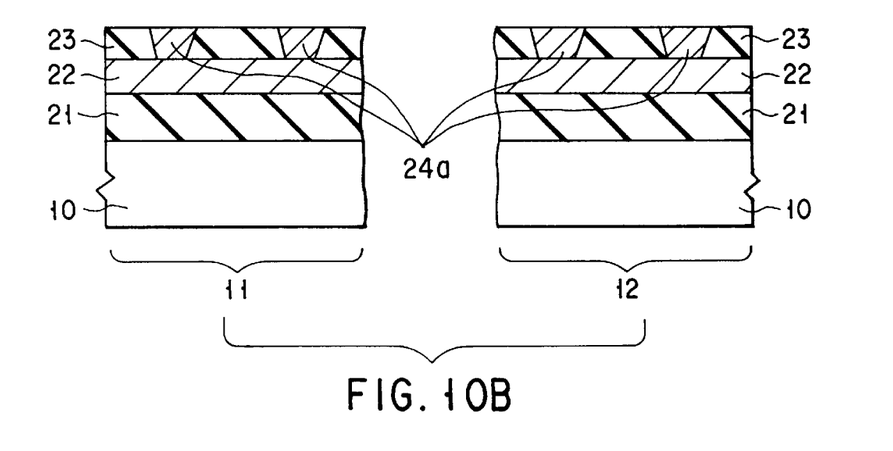

Next, in the second insulating layer 23, there is formed a hole for forming the contact plug on the contact pattern on the wiring pattern of the first wiring layer. Then, a burying processing is provided to the hole, thereby forming the first contact plug 24a (FIG. 10B).

Figure 10C:
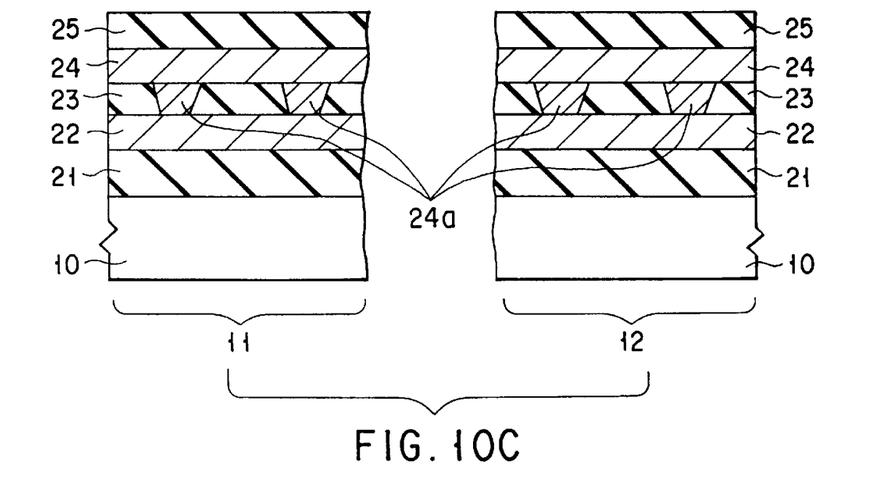

After forming the contact plug 24a, there is formed the second wiring layer 24 in which the wiring pattern is designed to be different from the first wiring layer. Then, on the second wiring layer, there is formed the third insulating layer 25 (FIG. 10C).

Figure 10D:
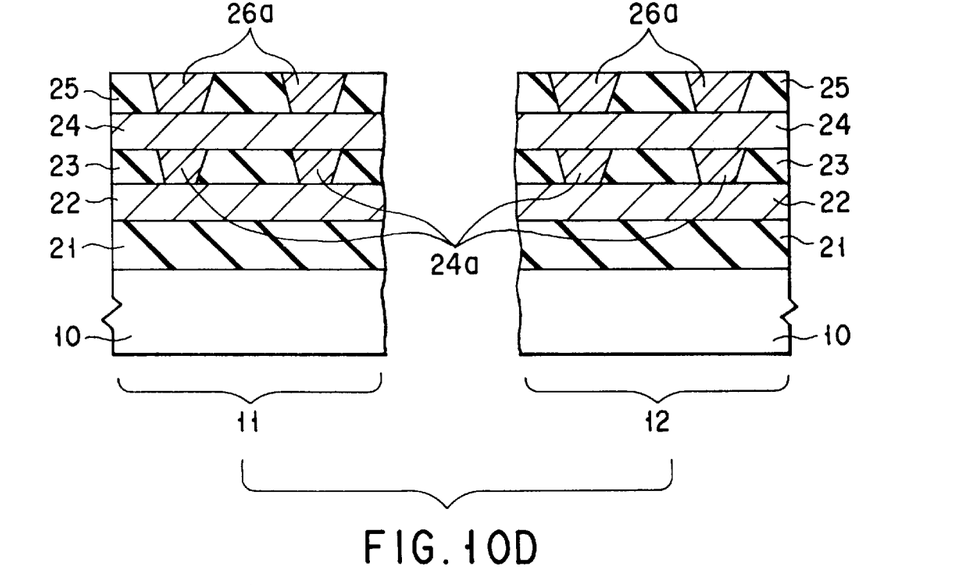

Next, in the third insulating layer 25, there is formed a hole for forming the contact plug on the contact pattern formed on the wiring pattern of the second wiring layer. Then, a burying processing is provided to the hole, thereby forming the first contact plug 26a (FIG. 10D).

Figure 10E:
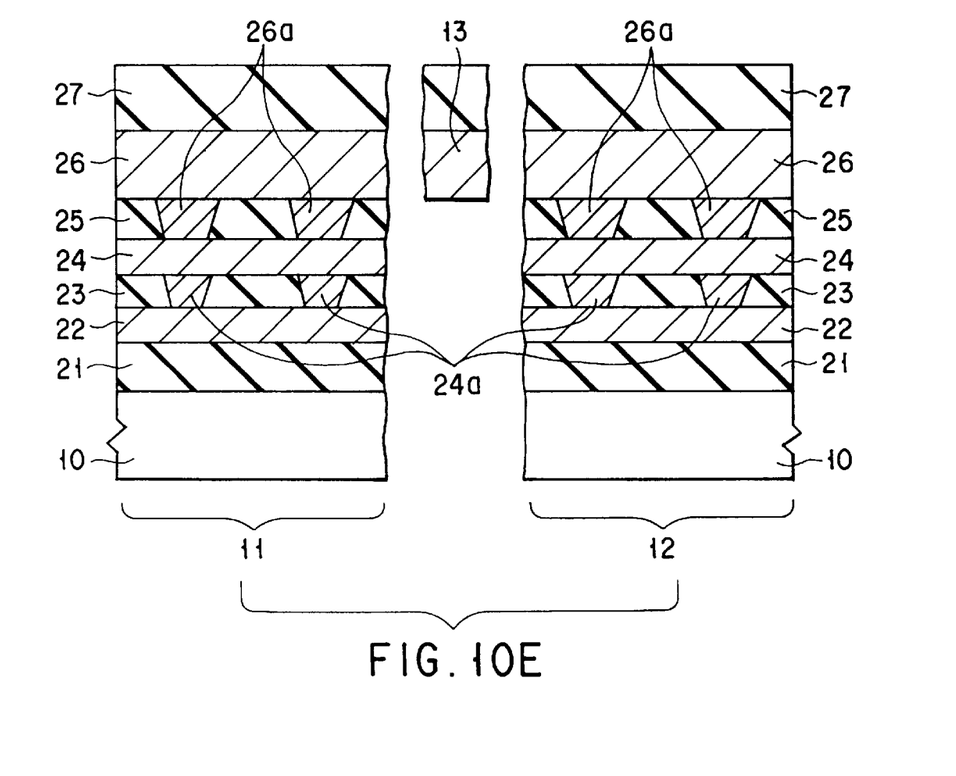

After forming the contact plug 26a, the third wiring layer 24 is formed. In the memory section 12, there is formed the third wiring layer 26 in which the same wiring pattern as the second wiring layer is designed (FIGS. 5 and 6A). Also, in forming the third wiring layer, the macro interconnection wiring 13 is simultaneously formed. On these third wiring layer 26 and the macro interconnection wiring layer 13, there is formed the fourth insulating layer 27. Thereby, the manufacture of LSI is completed (FIG. 10E).

In forming the wiring layer other than the third wiring layer 26 and the insulating layer, there is a case in which the surface of the wiring layer or that of the insulating layer is flattened.

Also, the wiring pattern shown in FIG. 6B or FIG. 6C can be used as the wiring pattern of the second wiring layer.

Further, according to the above-mentioned manufacturing method, the wiring width of the wiring pattern of the third wiring layer can be made different from that of the second wiring layer.

The contact plug 24 is used to connect the wiring contact pattern of the second wiring layer to the contact pattern of the first wiring layer 22. Then, the contact plug 24 may be formed simultaneously with the wiring pattern 24b of the second wiring layer when the second wiring layer 24 is formed after forming the hole on the second insulating layer 23.

The contact plug 26a is used to connect the wiring contact pattern of the third wiring layer to the contact pattern of the second wiring layer 24. Similar to the case of the contact plug 24a, the contact plug 26a may be formed simultaneously with the wiring pattern of the third wiring layer in forming the third wiring layer 26.

The LSI of the third embodiment can be manufactured by the above-mentioned manufacturing method. The detailed explanation of the manufacturing method of the LSI of the third embodiment will be omitted.

Next, the following will explain the manufacturing method of the LSI of the second embodiment with reference to FIGS. 12A to 12D.

Figure 12A:
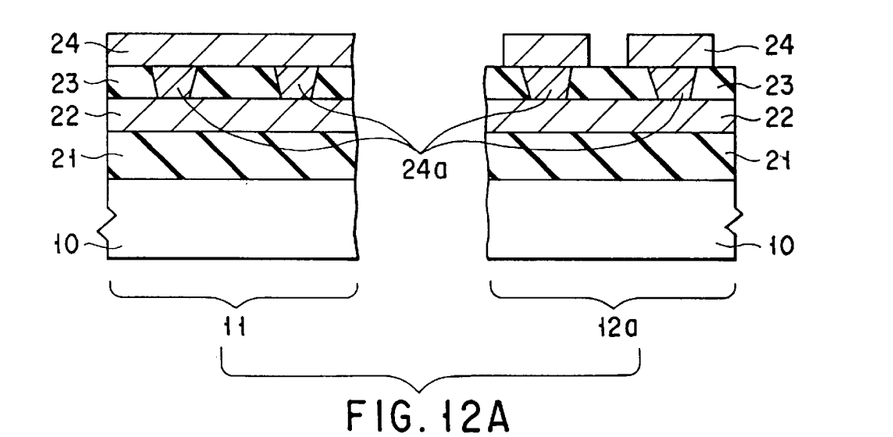
FIGS. 12A to 12D are cross-sectional views respectively showing metal wiring processes of the LSI of FIG. 7.

First of all, the element is formed in each of the first macro cell area 11 and the second macro cell area 12a, so that the first insulating layer 21 is formed on the semiconductor substrate. Thereafter, since the processing up to the formation of the contact plug 24a is the same as the above-mentioned manufacturing method, the specific explanation will be omitted.

After forming the contact plug 24a, on the ASIC section 11, there is formed the second wiring layer 24 in which the wiring pattern different from the first wiring layer is designed. On the other hand, in the memory section 12a, there is formed the contact pattern 24c of FIG. 8B on the contact plug 24a (FIG. 12A). A lithography processing and a flattening processing must be performed in forming the contact pattern in the memory section 12a.

Figure 12B:
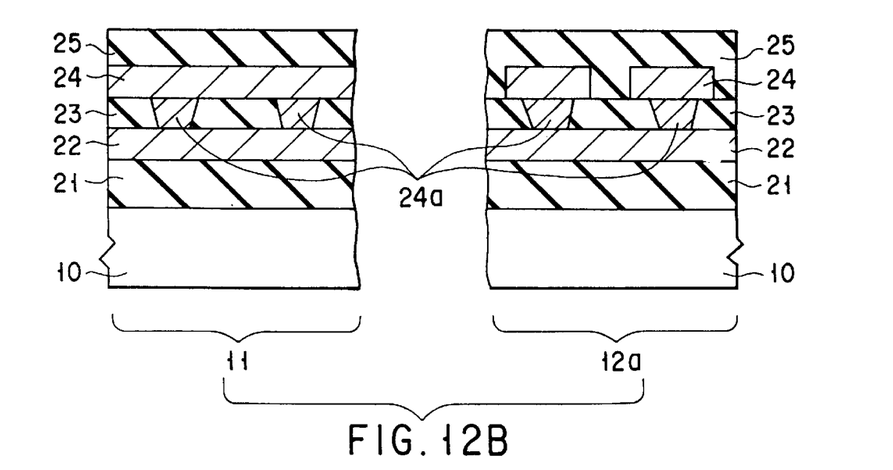
Figure 12C:
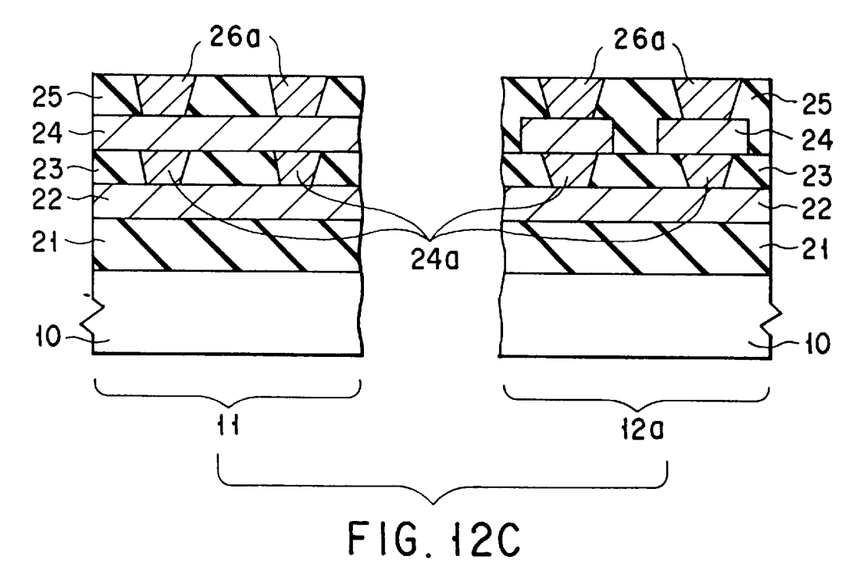

Next, on the second wiring layer 24 and the contact pattern 24c, there is formed the third insulating layer 25 (FIG. 12B). In the third insulating layer 25, there is formed the hole for forming the contact plug on the contact pattern of the second wiring layer. Then, the burying processing is provided to the hole, so that the contact plug 26a is formed (FIG. 12C).

Figure 12D:
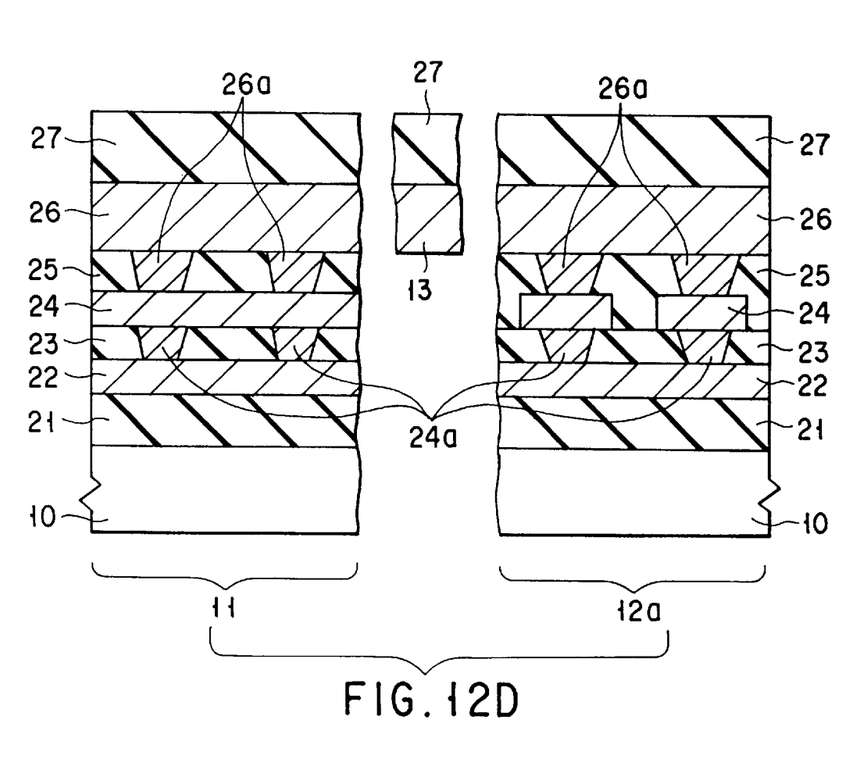

After forming the contact plug 26a, the third wiring layer 26 is formed. In the memory section 12a, there is formed the third wiring layer 26 in which the same wiring pattern as the first wiring layer is designed (FIGS. 5 and 6A). In forming the third wiring layer, the macro interconnection wiring 13 is simultaneously formed. On these third wiring layer 26 and the macro interconnection wiring layer 13, there is formed the fourth insulating layer 27. Thereby, the manufacture of LSI is completed (FIG. 12D).

In forming the wiring layer other than the third wiring layer 26 and the insulating layer, there is a case in which the surface of the wiring layer or that of the insulating layer is flattened.

Further, according to the above-mentioned manufacturing method, the wiring width of the wiring pattern of the third wiring layer can be made different from that of the second wiring layer.

Figure 11:
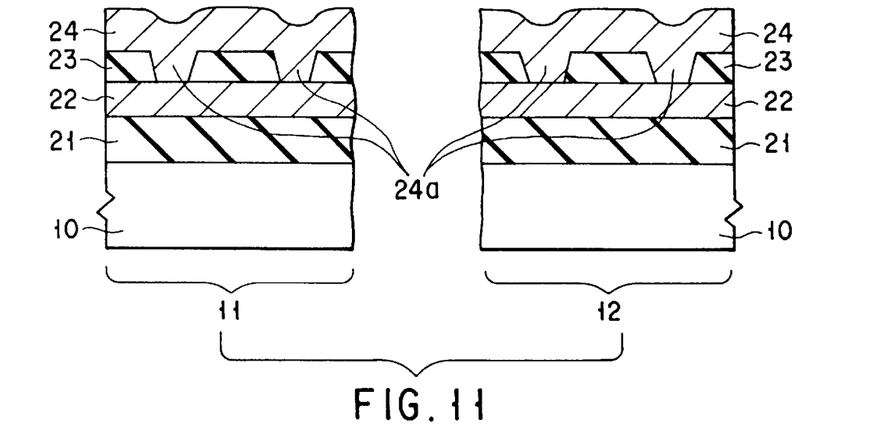
FIG. 11 is a cross-sectional view showing a modification of the metal wiring process of the LSI of FIG. 3.

The contact plug 24a is used to connect the wiring contact pattern of the second wiring layer to the contact pattern of the first wiring layer 22. Then, similar to the case explained with reference to FIG. 11, the contact plug 24a may be formed simultaneously with the wiring pattern 24b of the second wiring layer when the second wiring layer 24 is formed after forming the hole on the second insulating layer 23. Also, the wiring contact pattern of the third wiring layer may be formed in the same method.

Thus, according to the present invention, the increase in the wiring resistance can be restricted even if the film thicknesses of the wiring layer of the macro cell whose originally necessary number of wiring layers is small is reduced when a plurality of macro cells whose originally necessary number of metal wiring layers is embedded on the same semiconductor chip. As a result, the potential drop caused by the increase in the wiring resistance and the increase in the wiring delay can be restricted, thereby preventing the deterioration of the performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A semiconductor integrated circuit device comprising:
    a semiconductor substrate having first and second kinds of macro; and
    N wiring layers (N≧3) formed on said semiconductor substrate sequentially from a first wiring layer to an N-th wiring layer,
    wherein (N–1)-th wiring layer on said first kind of macro cell includes a first wiring pattern having a plurality of pattern segments, N-th wiring layer on said first kind of macro cell includes a second wiring pattern having at least a part of the plurality of pattern segments.

2. The semiconductor integrated circuit device according to claim 1, wherein said part of the plurality of pattern segments of said second wiring pattern is arranged at the same position as corresponding pattern segments of said first wiring pattern with the same shape.

3. The semiconductor integrated circuit device according to claim 1, further comprising a contact plug for connecting the contact pattern of said second wiring pattern to a corresponding contact pattern of said first wiring pattern.

4. The semiconductor integrated circuit device according to claim 1, wherein said first wiring pattern includes a power supply line for supplying operation power of said first kind of macro cell, and a critical signal line for transmitting a signal of said first kind of macro cell.

5. The semiconductor integrated circuit device according to claim 4, said part of the plurality of pattern segments of said second wiring pattern includes the power supply line.

6. The semiconductor integrated circuit device according to claim 4, wherein said part of the plurality of pattern segments of said second wiring pattern includes the critical signal line.

7. The semiconductor integrated circuit device according to claim 1, wherein said N-th wiring layer includes a macro interconnection wire for connecting said first and second kinds of macro cells to each other.

8. The semiconductor integrated circuit device according to claim 1, wherein each of said N wiring layer layers has an equal thickness.

9. The semiconductor integrated circuit device according to claim 1, further comprising N+1 insulating layers formed on each of said semiconductor substrate and said N wiring layers, and each of said N+1 insulating layers has an equal thickness.

10. The semiconductor integrated circuit device according to claim 1, wherein said N-th wiring layer is the thickest among said N wiring layers.

11. The semiconductor integrated circuit device according to claim 1, wherein surfaces of said first to (N–1)-th wiring layers are flattened.

12. The semiconductor integrated circuit device according to claim 1, wherein said part of the plurality of pattern segments of said second pattern is an enlarged pattern segment in a line width direction as compared with the pattern segment of said first wiring pattern.

13. The semiconductor integrated circuit device according to claim 1, wherein said plurality of pattern segments include one or more contact patterns.

14. The semiconductor integrated circuit device according to claim 13, wherein said first macro cell is a memory cell, and said second macro cell is an ASIC (application-specific integrated circuit) cell.

15. A semiconductor integrated circuit device comprising:
    a semiconductor substrate having first and second kinds of macro cells; and
    N layers (N≧3) formed on said semiconductor substrate sequentially from a first wiring layer to an N-th wiring layer,
    wherein (N–2)-th wiring layer on said first kind of macro cell includes a first wiring pattern having a plurality of pattern segments, said plurality of pattern segments has a contact pattern, (N–1)-th wiring layer on said first kind of macro cell includes a second wiring pattern having the contact pattern, and the Nth wiring layer on said first macro cell includes a third wiring pattern having at least a part of the plurality of pattern segments.

16. The semiconductor integrated circuit device according to claim 15, wherein said part of the plurality of pattern segments of said second wiring pattern is arranged at the same position as corresponding pattern segments of said first wiring pattern with the same shape.

17. The semiconductor integrated circuit device according to claim 15, further comprising a first contact plug for connecting the contact pattern of said third wiring pattern to a corresponding contact pattern of said second wiring pattern, and a second contact plug for connecting the contact pattern of said second wiring pattern to a corresponding contact pattern of said first wiring pattern.

18. The semiconductor integrated circuit device according to claim 15, wherein said first wiring pattern includes a power supply line for supplying operation power of said first kind of macro cell, and a critical signal line for transmitting a signal of said first kind of macro cell.

19. The semiconductor integrated circuit device according to claim 15, wherein said N-th wiring layer includes a macro interconnection wire for connecting said first and second kinds of macro cells to each other.

20. The semiconductor integrated circuit device according to claim 15, wherein each of said N wiring layers has an equal thickness.

21. The semiconductor integrated circuit device according to claim 15, further comprising N+1 insulating layers formed on each of said semiconductor substrate and said N wiring layers, and each of said N+1 insulating layers has an equal thickness.

22. The semiconductor integrated circuit device according to claim 15, wherein said N-th wiring layer is the thickest among said N wiring layers.

23. The semiconductor integrated circuit device according to claim 15, wherein surfaces of said first to (N–1)-th wiring layers are flattened.

24. The semiconductor integrated circuit device according to claim 15, wherein said first macro cell is a memory cell, and said second macro cell is an ASIC (application-specific integrated circuit) cell.

25. The semiconductor integrated circuit device according to claim 18, said part of the plurality of pattern segments of said third wiring pattern includes the power supply line.

26. The semiconductor integrated circuit device according to claim 18, wherein said part of the plurality of pattern segments of said third wiring pattern includes the critical signal line.

27. The semiconductor integrated circuit device according to claim 26, further comprising n+1 insulating layers formed on each of said semiconductor substrate and said n wiring layers, and each of said n+1 insulating layers has an equal thickness.

28. A semiconductor integrated circuit device comprising:
- a semiconductor substrate having a first macro cell which is designed to have m wiring layers and a second macro cell which is designed to have n (n>m) wiring layers; and
- m wiring layers formed on said semiconductor substrate sequentially from a first wiring layer to an m-th wiring layer,
- wherein at least a part of a wiring pattern of an m-th wiring layer of the first macro cell is also formed in at least one of (m+1)-th wiring layer to the n-th wiring layer of the second macro cell.

29. The semiconductor integrated circuit device according to claim 28, wherein said wiring pattern of the m-th wiring layer of the first macro cell is also formed in the n-th wiring layer.

30. The semiconductor integrated circuit device according to claim 28, wherein said wiring pattern of the m-th wiring layer of the first macro cell includes a power supply line and said power supply line is also formed in the n-th wiring layer.

31. The semiconductor integrated circuit device according to claim 28, wherein said wiring pattern of the m-th wiring layer of the first macro cell includes a critical signal line and said critical signal line is also formed in the n-th wiring layer.

32. The semiconductor integrated circuit device according to claim 28, wherein said part of the wiring pattern of the m-th wiring layer and said part of the wiring pattern of at least one of the (m+1)-th wiring layer to the n-th wiring layer are formed at the same position with the same shape.

33. The semiconductor integrated circuit device according to claim 28, wherein said part of the wiring pattern of the m-th wiring layer and said part of the wiring pattern of at least one of the (m+1)-th wiring layer to the n-th wiring layer are formed at the same position with different shapes one of which is enlarged with respect to the other.

34. The semiconductor integrated circuit device according to claim 28, further comprising a contact plug for connecting the wiring patterns of the m-th wiring layer and the n-th wiring layer.

35. The semiconductor integrated circuit device according to claim 28, wherein said n-th wiring layer includes a macro interconnection wire for connecting said first and second macro cell to each other.

36. The semiconductor integrated circuit device according to claim 28, wherein each of said n wiring layers has an equal thickness (same as claim 8).

37. The semiconductor integrated circuit device according to claim 28, wherein said n-th wiring layer is the thickest among said n wiring layers.

38. The semiconductor integrated circuit device according to claim 28, wherein surfaces of each of said first to (N−1)-th wiring layers are flattened.

39. The semiconductor integrated circuit device according to claim 28, wherein said first macro cell is a memory cell, and said second macro cell is an ASIC cell.

40. A semiconductor memory device having N wiring layers comprising:
- a first layer of said N wiring layers having at least a first wiring pattern segment between a first contact point and a second contact point;
- a second layer of said N wiring layers having at least a second wiring pattern segment between said first contact point and said second contact point,
- wherein the first wiring pattern segment has the same shape as the second wiring pattern segment.

41. The semiconductor memory device according to claim 40, further comprising:
- an insulator separating said first layer from said second layer.

42. The semiconductor memory device according to claim 40, further comprising:
- a third layer of said N wiring layers located in between said first layer and said second layer;
- a first insulator between said first layer and said third layer; and
- a second insulator between said third layer and said first layer.

43. The semiconductor memory device according to claim 40, wherein a path length of the first wiring pattern segment measured between and a path length of the second wiring pattern segment are the same.

44. The semiconductor memory device according to claim 40, wherein the first wiring pattern segment is connected in parallel to the second wiring pattern.

45. A semiconductor memory device comprising:
- a first continuous conductor arranged between a first contact point and a second contact point, said first conductor having a first resistance between said first contact point and said second contact point;
- an insulator on said first conductor;
- a second continuous conductor connected to said first conductor through said first contact point and said second contact point, said second conductor having a second resistance between said first contact point and said second contact point,
- wherein the resistance between said first contact point and said second contact point after said first continuous conductor and said second continuous conductor are connected at said first and second contact points is less than or equal to approximately the first resistance multiplied by the second resistance divided by the sum of the first resistance and the second resistance.

* * * * *